United States Patent
Li et al.

(10) Patent No.: US 10,706,208 B1
(45) Date of Patent: Jul. 7, 2020

(54) PRIORITY AWARE BALANCING OF MEMORY USAGE BETWEEN GEOMETRY OPERATION AND FILE STORAGE

(71) Applicant: Synopsys, Inc., Mountain View, CA (US)

(72) Inventors: Hongchuan Li, Milpitas, CA (US); Aydin Osman Balkan, San Jose, CA (US)

(73) Assignee: Synopsis, Inc., Mountain View, CA (US)

( * ) Notice: Subject to any disclaimer, the term of this patent is extended or adjusted under 35 U.S.C. 154(b) by 0 days.

(21) Appl. No.: 16/542,956

(22) Filed: Aug. 16, 2019

Related U.S. Application Data

(60) Provisional application No. 62/719,392, filed on Aug. 17, 2018.

(51) Int. Cl.
| | |
|---|---|
| *G06F 17/50* | (2006.01) |
| *G06F 30/398* | (2020.01) |
| *G06F 16/17* | (2019.01) |
| *G06F 3/06* | (2006.01) |

(52) U.S. Cl.
CPC ......... *G06F 30/398* (2020.01); *G06F 3/0604* (2013.01); *G06F 3/0647* (2013.01); *G06F 3/0673* (2013.01); *G06F 16/1734* (2019.01)

(58) Field of Classification Search
CPC .. G06F 30/398; G06F 16/1734; G06F 3/0604; G06F 3/0673; G06F 3/0647
USPC ........................................................ 716/55
See application file for complete search history.

(56) References Cited

U.S. PATENT DOCUMENTS

| | | | |
|---|---|---|---|
| 6,099,580 A * | 8/2000 | Boyle | G06F 30/327 716/114 |
| 6,952,760 B2 | 10/2005 | Boucher et al. | |
| 7,788,610 B2 | 8/2010 | Emek et al. | |
| 8,386,975 B2 * | 2/2013 | White | G06F 30/367 716/108 |
| 9,652,393 B1 | 5/2017 | Kang et al. | |
| 2008/0162856 A1 | 7/2008 | Chai et al. | |
| 2018/0357161 A1 * | 12/2018 | Bobroff | G06F 12/0253 |

* cited by examiner

*Primary Examiner* — Jack Chiang
*Assistant Examiner* — Brandon Bowers
(74) *Attorney, Agent, or Firm* — Bever, Hoffman & Harms, LLP

(57) ABSTRACT

A dynamic memory management method for layout verification tools that maximizes main memory usage and minimizes required disk storage capacity. Layout data generated during each given geometric operation is retained in main memory at the end of the given geometric operation. At the beginning of each new (current) geometric operation, an estimated amount of main memory required to perform the current geometric operation at peak processing speed is determined. When insufficient available main memory is available, a Central Balancer Module determines whether previously generated layout data can be moved from main memory to disk storage. Layout data file(s) are then selected based on minimizing the amount of transferred layout data needed to provide the required estimated amount. A Distributed File Manager then transfers the selected layout data file(s) from main memory to disk storage, thereby facilitating execution of the current geometric operation at peak operating speed.

15 Claims, 6 Drawing Sheets

PRIORITY AWARE BALANCING OF MEMORY USAGE BETWEEN GEOMETRY OPERATION AND FILE STORAGE

RELATED APPLICATION

This application claims priority from U.S. Provisional Patent Application 62/719,392, entitled "Priority Aware Balancing of Memory Usage Between Geometry Operation and File Storage", which was filed on Aug. 17, 2018, and is incorporated by reference herein.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMER

*In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.*

FIELD OF THE INVENTION

This invention relates to electronic design automation and, more particularly, to layout verification of circuit designs.

BACKGROUND OF THE INVENTION

Electronic design automation (EDA) toolsets are utilized by circuit developers to design and fully test their circuit designs before manufacturing (i.e., fabricating or otherwise producing) physical circuit structures. The term "circuit design" refers to a software-based description of an integrated circuit (IC) at any stage of the development process, from an initial circuit concept (general system level description) to a final taped-out description suitable for transfer to a fabrication facility. Modern EDA toolsets typically include a suite of tools that seamlessly integrate different operations associated with the design/development of a circuit design, such as system and logic design tools, synthesis and layout tools, routing and mask preparation tools, and tools for various types of testing and verification. Because modern ICs (e.g., System-on-Chip devices) can include billions of transistors and other circuit elements arranged in thousands interconnected circuits (e.g., processors, memory arrays, etc.), EDA toolsets have become essential in development of all modern circuit designs. Moreover, because the post-fabrication discovery of design flaws can cause significant production delays and significantly affect profitability of a circuit device, EDA tools have become essential in the pre-fabrication testing/verification of modern circuit designs. That is, without EDA software tools, the commercially viable development a modern circuit design from concept to physical circuit device would be practically impossible.

Layout verification (aka physical verification) is a specific testing/verification process that verifies the manufacturability of a circuit design. Design Rule Checking (DRC) is one type of layout verification that involves verifying that a circuit design's layout conforms with established design rules, which are geometric constraints imposed on circuit device layout to ensure that the circuit design functions properly and can be produced with an acceptable yield. Other layout verification processes include layout versus schematic (LVS), XOR check, antenna check and electrical rule check (ERC).

When applied to modern ICs, DRC operations involving even simple design rules can be extremely expensive computationally. A conventional DRC operation generally involves utilizing a powerful two-dimensional geometry engine that supports geometric operations such as Boolean operations like AND, OR, NOT, XOR; sizing operations like grow/shrink horizontal/vertical/diagonal, along with other operations like merge, shift, flip, cut and smooth, as well as all-angle geometry for true Euclidean distance calculations. Individual rules are typically checked individually over an entire layout region, as well as individual rule values of same rule (e.g., a check against the minimum value for a rule, and another check against a preferred value for the same rule). Each check basically runs an independent sequence of geometric operations, and numerous passes through the layout region are required, with each geometric operation involving receives layer data and/or additional data as input data, performing the designated geometric, sizing or other operation, and then producing new layers and/or additional data as output data. When applied to the layout of a billion-plus-transistor circuit design associated with a modern IC, it is readily apparent that substantial processing power and vast memory resources are required to perform DRC on modern circuit designs.

Conventional layout verification tools, such as the IC Validator tool produced by Synopsys, Inc. of Mountain View, Calif., USA, deal with the massive amount of processing and data associated with a DRC (or other layout verification) operation by implementing parallel computing and memory management schemes to facilitate completion of DRC operations in an acceptable timeframe. Parallel computing of a DRC operation typically involves dividing the total number of rule checks to be processed in to sets of geometric operations, and then assigning each geometric operation set to a specific CPU of a parallel computing system (e.g., a multi-core or multi-processor computer, a computer cluster, a massively parallel processor array, or a computing grid). While a given CPU is executing its assigned set of geometric operations, a memory management scheme is utilized to coordinate the efficient allocation of shared main memory resources (e.g., high-speed random-access memory) among various interconnected CPUs, for example, of a multi-core or multi-processor computer. By executing the multiple rule check sets in parallel (i.e., such that multiple CPUs process different rule check sets simultaneously) using efficient memory management schemes, parallel computing substantially reduces the amount of time required to complete DRC processing of a modern IC's circuit design (i.e., in comparison to a single CPU approach).

FIG. 7 depicts a generalized and greatly simplified series of operations executed by a geometry engine 60 and a memory manager 70 of a conventional layout verification tool 50 at the beginning of a current (next-scheduled) geometric operation of a geometric operation set assigned to a given CPU.

Referring to the top of FIG. 7, geometry engine 60 estimates the amount of main memory that will be needed (block 61) before beginning the current geometric operation. The estimated memory amount is typically accurately generated using established proprietary techniques. Alternatively, a rough estimate may be calculated by multiplying a fixed amount of memory with the number of geometric shapes to be processed during the current geometric operation. Geometry engine 60 then sends a request 63 for the estimated memory amount to memory manager 70 (block 62).

Next, memory manager 70 determines whether sufficient main memory is available to process the current geometric operation. As indicated by dot-line-arrow 81, a current amount of available memory 85 in main memory 80 is provided to memory manager 70 using known techniques. Upon receiving request 63, memory manager 70 compares the estimated memory amount with currently available memory 85 (block 72). Referring to decision block 73, if the amount of available memory 85 is equal to or greater than the estimated memory amount requested (Yes branch from decision block 73), then memory manager 70 transmits memory address information or otherwise operably instructs geometry engine 60 to proceed with the current geometric operation (block 74). Conversely, if the amount of available memory 85 is less than the estimated memory amount requested (No branch from decision block 73), then memory manager 70 operably instructs geometry engine 60 to postpone (delay) execution of the current geometric operation.

Upon receiving an instruction from memory manager 70, geometry engine 60 then either performs the current geometric operation (block 65) or postpones the current geometric operation for an established time period (block 66). Referring to block 65, performance of the current geometric operation by geometry engine 60 generally involves reading previously generated (old) layer and/or additional data 95-1 read from disk memory 90 as input (indicated by arrow 91-1), writing and reading temporary data (TEMP DATA) in available main memory 85 (indicated by dashed-line arrows 83), and then, upon completion of the current geometric operation, writing as output updated (new) layer and/or additional data 90-2 to disk memory 90. Conversely, when memory manager 70 instructs geometry engine 60 to postpone (delay) execution of the current geometric operation (block 66), geometry engine 60 waits a predetermined delay period and then re-submits the request for memory (i.e., as indicated by arrow 67).

As indicated in FIG. 7, conventional layout verification processes are characterized by utilizing main memory 80 to store temporary data files during execution of a geometric operation, and disk memory 90 to store old layer data files 90-1 generated by previously performed geometric operations for use as input in subsequently performed geometric operations. The motivation for using this arrangement in conventional layout verification tools is to maximize the amount of available main memory for performing current geometric operations, thereby attempting to minimize processing time by way of minimizing the chance of delays caused by insufficient available memory. However, as the size of circuit designs for modern ICs continues to increase, it is becoming increasingly expensive to set-up and reliably maintain the large-scale remote disk servers needed to store all layer data files generated during a DRC process.

Another increasingly significant problem associated with conventional layout verification tools is processing delays caused by increasingly longer disk access times. It is generally understood that it takes less time for a given CPU to access data stored in main memory than to access data stored on a local disk (i.e., main memory access times are faster than disk access times). However, while traditional CPU-local-disk access times may have been tolerable in early layout verification tools, there is an increasing trend toward implementing conventional distributed layout verification tools using large compute clusters and distributed file systems in order to facilitate storage of the massive amounts of layer data generated during layout verification of modern ICs. When conventional distributed layout verification tools are implemented in such networked systems, the layer data is transmitted through the network bus between distributed CPUs and disk storage, which adds more delay on top of a traditional CPU-local-disk access time. When applied to modern IC circuit designs, the disk access times associated with implementing conventional distributed layout verification tools in networked systems can add significant delay to completion of layout verification processes.

What is needed is a method for managing memory resources during a DRC (or other layout verification) process that balances memory usage between geometric operations and file storage in a way that both maximizes geometric operation processing speed and minimizes the use of disk storage.

SUMMARY OF THE INVENTION

The claims signify a brief description of one or more of the innovations, embodiments, and/or examples found within this disclosure.

The present invention is directed to a method for dynamically managing memory resources during a layout verification (e.g., DRC) process in which all new geometric operation output data files are initially stored in main (internal RAM) memory resources, and selected geometric operation data files are only transferred (moved) from the main memory resources to disk (external) memory resources when additional main memory resources are required to perform a current (e.g., next sequential) geometric operation at peak processing speed. According to an aspect of the invention, when additional main memory resources are required, data files are selected for transfer out of main memory in a way that minimizes the amount of transferred data (i.e., such that substantially all main memory resources are either occupied by remaining data files or allocated for the new geometric operation), thereby facilitating execution of the current geometric operation at peak processing speeds while also minimizing disk storage requirements by way of maximizing data file storage in the main memory resources. The invention is based on the general observation that utilizing idle main memory resources to store layer data files enhances processor efficiency (i.e., by way of minimizing disk access delays produced by reading data files from disk memory resources) and may also significantly reduce the disk storage capacity required to perform DRC processes, which would provide a commercial advantage to layout verification tools by reducing the cost of computing systems capable of performing layout verification on modern IC circuit designs. However, a solution that uses main memory to store layer data files must address two constraints that can significantly impact the processing speed of geometric operations and the amount of data stored in main memory: first, the processing speed of geometric operations will decrease if the CPU (processor) does not have access to sufficient amount of main memory; and second, in a distributed layout verification system with multiple concurrent geometric operation processes are performed by multiple processors, the amount of used (i.e., occupied by or allocated for layer data generated by an associated geometric operation) and unused (unoccupied) main memory fluctuates frequently, possibly by large amount. The present invention achieves the benefits associated with the above-mentioned observations while addressing these constraints by way of dynamically monitoring main memory usage and only moving/transferring an amount of layer data from main memory to disk memory that is required to perform each new (current) geometric operation at peak processing speed. Accordingly, layout verification tools implementing the dynamic memory management method of the present invention exhibit reduced DRC runtimes and enhanced processor efficiency by (i) prioritizing the allocation of main memory resources to new/current geometric operations, whereby all new/current geometric operations are reliably processed at peak processing speeds, and (ii) minimizing disk access delays by maximizing the amount of previously generated layout data retained/stored in main memory. The dynamic memory management method of the present invention also reduces the amount of disk (storage memory) capacity required to perform layout verification on modern IC circuit designs, thereby reducing the overall system and operating costs associated with using the improved layout verification tools.

According to an embodiment of the invention, a dynamic method for managing memory resources during a layout verification process begins by determining an estimated minimum amount by which available main memory resource capacity must be increased to perform the current geometric operation at peak processing speed. The estimated minimum amount is determined before performing a current geometric operation (i.e., before main memory resources are utilized to store temporary data files). In one embodiment, the estimated minimum amount by which available main memory resource capacity must be increased is determined by generating an estimated memory amount required to perform the current geometric operation, and subtracting or otherwise calculating a difference between the current available memory amount and the estimated current memory amount. When insufficient main memory resources are available, a determination is made as to whether one or more previously generated geometric operation data files are stored in main memory resources that qualify for transfer to disk memory.

Next, when additional main memory space is needed and one or more transferrable previously generated geometric operation data files are current stored in main memory, one or more data files that most closely matches the estimated minimum amount are selected for transfer to storage (disk) memory. As set forth above, the one or more data files are selected for transfer such that removal (i.e., transfer) of the one or more data files from the main memory provides just enough available space to perform the current geometric operation (i.e., a difference between an amount of unavailable portion occupied by the one data file and the estimated minimum amount is minimized). For example, if 1 GB of additional main memory is needed, then the data files selected for transfer would ideally have a sum-total size of 1 GB; if no combinations of one or more data file sizes equals 1 GB, then a combination would be selected such that the sum-total size exceeds 1 GB by the smallest possible amount. In alternative embodiments, the selection of data files for transfer from main memory to disk memory is performed either by a central balancer module or a distributed file manager module.

After selecting one or more data files, the dynamic memory management method performs a transfer of the selected data file from main memory to disk memory, whereby the amount of available main memory is correspondingly increased by an amount equal to the portion previously occupied by the transferred data files. In a presently preferred embodiment, the transfer is performed using a distributed file manager module that is operably coupled between the main memory resources and the storage memory resources.

Finally, after the transfer of selected data files is completed, the dynamic memory management method authorizes performance of the current geometric operation using the newly-available main memory space. According to another feature of the present invention, unlike conventional approaches, a current geometric operation data file including layer data generated during the current geometric operation is maintained in main memory (i.e., it is not moved to disk prior to beginning performance of a next-sequential geometric operation).

According to an alternative practical embodiment, the dynamic memory management method described herein is implemented in an EDA toolset as part of an improved layout verification tool. In a presently preferred embodiment, the improved layout verification tool utilizes a geometry engine module and a memory management module in a manner similar to that used in conventional tools, and implements the dynamic memory management method using a Central Balancer Module (CBM) and a distributed file manager module in a way that facilitates efficient incorporation of the present invention into existing layout verification tools. The CBM communicates with the improved layout verification tool's memory manager module and the distributed file manager module to ensure that main memory resources are made available for current geometric operations when needed, and to ensure that main memory resources are used to store layout data files when not needed for geometric operations. The distributed file manager module functions to transfer data between main memory resources and storage (disk) memory resources in response to instructions received from the CBM. In a practical embodiment, the distributed file manager module is utilized in conjunction with a Modern Linux Operating System to store layout data files either in a Tmpfs main memory system or a storage (disk) memory system. When it becomes necessary, selected data files can be moved from Tmpfs (main memory) to disk (secondary memory) to give geometric operation access to more available memory for execution resources. In one specific embodiment the data-file-for-transfer selection process is performed by the CBM; in this case the CBM sends a list of selected data files to the distributed file manager, which would then transfer the listed files from Tmpfs (main memory) to disk (secondary memory). Alternatively, the data-file-for-transfer selection process is performed by the Distributed File Manager. Regardless of which module performs the data-files-for-transfer selection, this approach increases the amount of available Tmpfs memory to facilitate the execution for geometric operations at peak. When the amount of available Tmpfs memory changes, the distributed file manager reports the updated available memory amount to the CBM.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

BRIEF DESCRIPTION OF THE DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION OF THE DRAWINGS

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Figure 1:
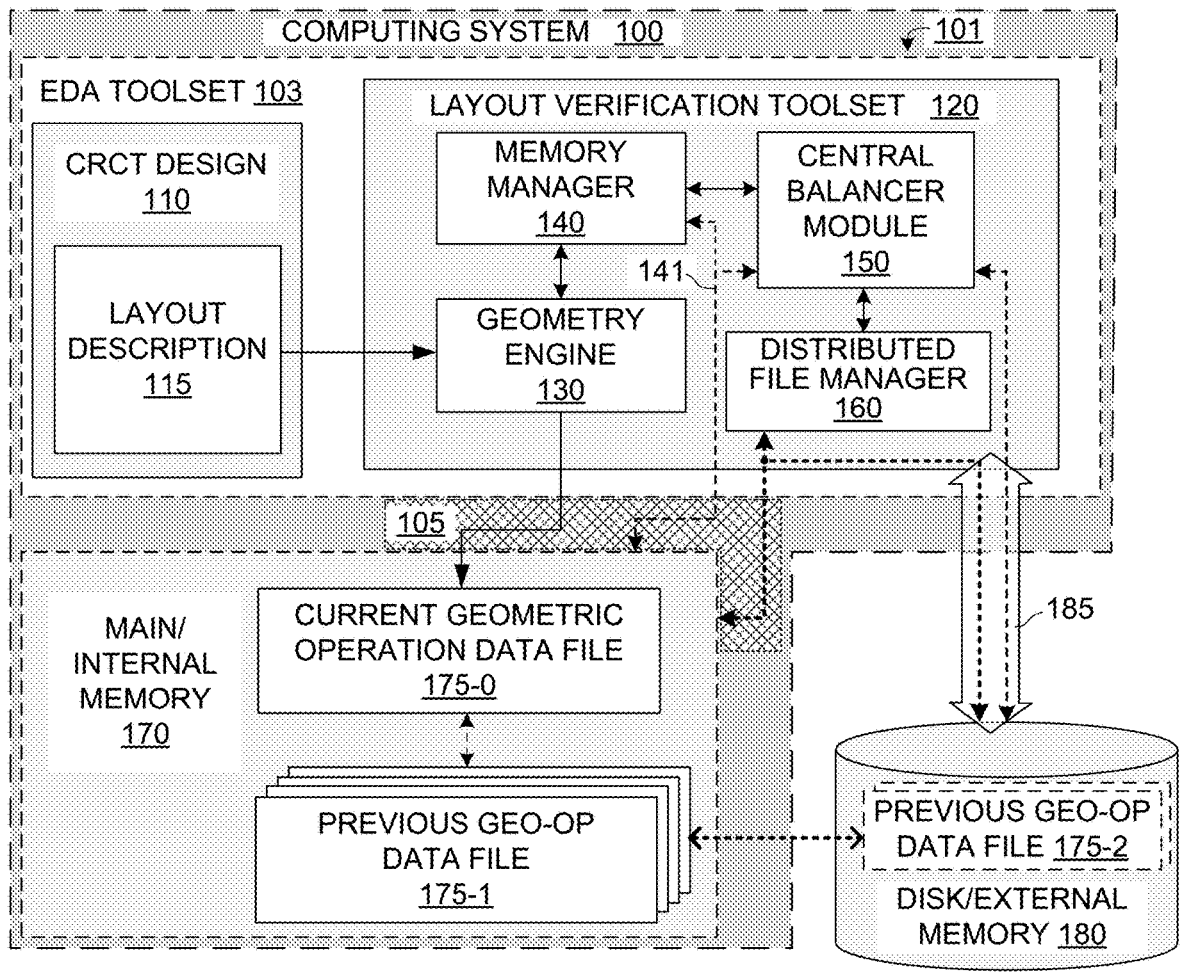
FIG. 1 is a block diagram depicting a partial EDA toolset including an improved layout verification tool configured to implement a dynamic memory management methodology in accordance with a specific embodiment of the present invention.

FIG. 1 is a block diagram generally depicting an exemplary computing system 100 configured to implement a computer-implemented EDA toolset 103, which in turn includes an exemplary target circuit design 110 and an improved layout verification tool 120 according to an exemplary embodiment of the present invention.

Computing system 100 includes a processor (CPU) 101 that is operably configured by way of instructions provided by layout verification tool 120 to implement the memory management methodology described below in accordance with the present invention. Computing system 100 also includes main memory resources 170 that are directly coupled to the CPU by way of an internal bus 105, and storage (e.g., disk) memory resources 180 that are indirectly coupled to the CPU by way of an external (e.g., system or network) bus 185. As used herein, the phrases "main memory" and "main memory resources" refer to primary memory resources that store information for immediate use by a CPU, and are typically implemented using high-speed memory (e.g., random-access memory (RAM)) circuitry that is directly addressable at relatively high access speeds by the CPU over internal bus 105. In contrast, the phrase "storage memory resources" refers to secondary memory resources (e.g., disk drives) that provide a large storage capacity but at the cost of relative slow access speeds. The phrases "directly coupled" and "indirectly coupled" are utilized herein for brevity to reference typical conventional bus configurations utilized to facilitate communications between CPU 101 and main memory resources 170 and secondary memory resources 180, respectively. Storage memory resources 180 are sometimes referred to herein as "disk memory" for brevity, but it is understood that storage memory resources may include any secondary storage devices (e.g., solid-state storage devices) unless specifically precluded in the appended claims. Additional resources of computer system 100 that are not described with reference to FIG. 1 may be described below with reference to FIGS. 6A to 6C.

Circuit design 110 includes a generalized layout description 115 that is read by layout verification tool 120 during a typical layout verification process (e.g., Design Rule Check (DRC)). The term "layout" in this context refers to the physical design representation of circuit design 110. From a manufacturing perspective, the layout view may be closest to an actual manufacturing blueprint of the circuit. The layout view may be organized into base layers, which correspond to the different devices in the circuit, and interconnect wiring layers and via layers, which join together the terminals of the different devices. Non-manufacturing layers may be also be present in a layout for purposes of design automation.

Figure 7:
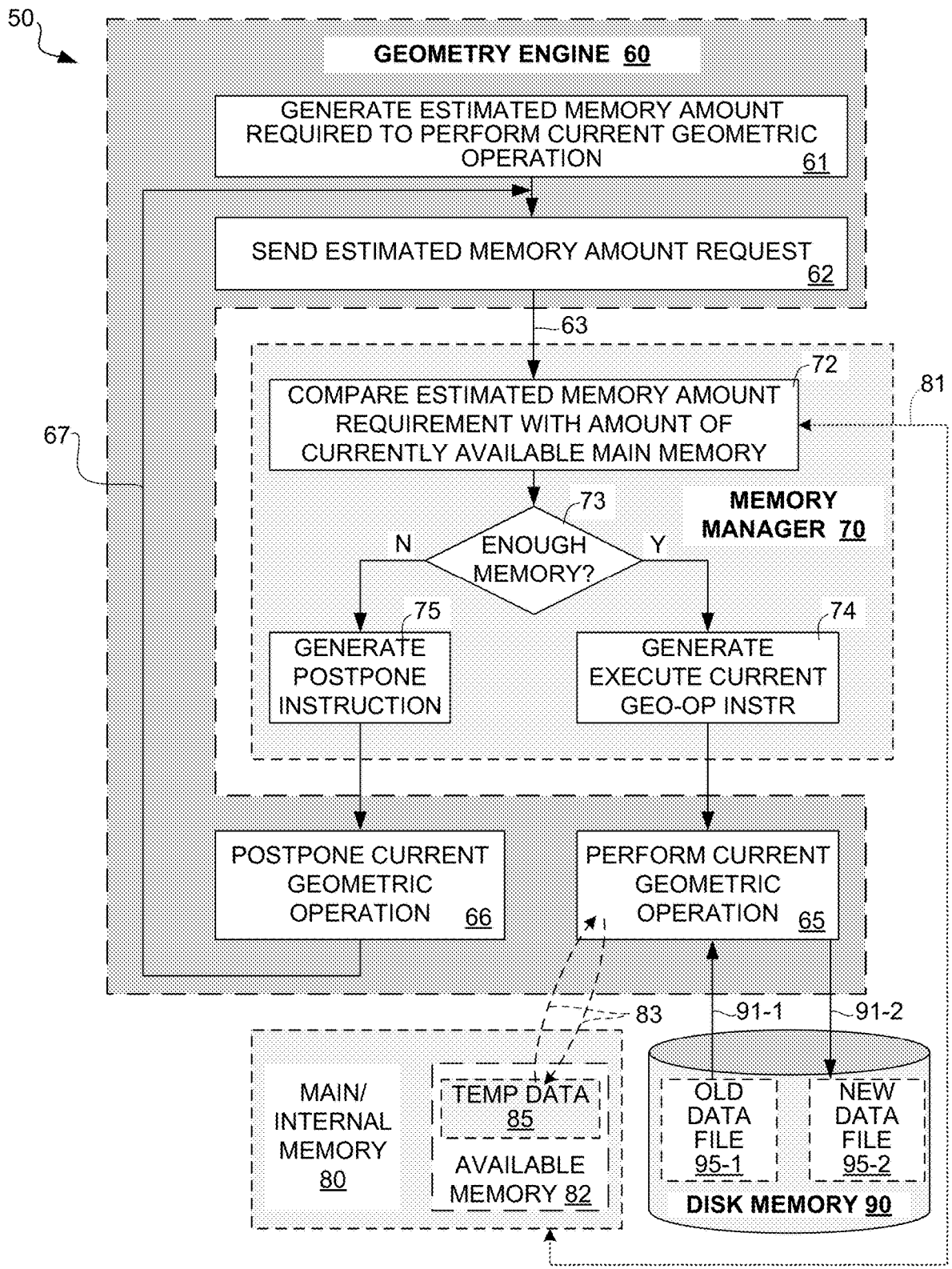
FIG. 7 is a block/flow diagram depicting an exemplary operation performed by a conventional layout verification tool.

Layout verification tool 120 is depicted in greatly simplified form and generally includes a geometry engine 130 and a memory manager module 140 that operate in a manner similar to associated modules utilized in a conventional layout verification tool (discussed above). That is, layout verification tool 120 is configured to verify layout description 115 of circuit design 110 by way of causing geometry engine 130 to perform multiple geometric operations, where each geometric operation involves receiving as input data previously-generated geometric operation layout data files and associated layout description data in the manner described below, processing the input data and then generating as output a corresponding current geometric data file that may be used as input data in a subsequently performed geometric operation. The specific operations performed by geometry engine 130 are essentially identical to those utilized by conventional layout verification tools. With certain exceptions below, memory manager module 140 also operates essentially identically to the conventional memory manager described above with reference to FIG. 7. conventional layout verification tools.

In the exemplary embodiment shown in FIG. 1, improved layout verification tool 120 is distinguished over conventional tools by way of including a Central Balancer Module (CBM) 150 and a Distributed File Manager module 160. As explained additional detail below, CBM 150 communicates with memory manager module 140 and Distributed File Manager module 160 to ensure that main memory resources 170 are made available for current geometric operations when needed, and to ensure that main memory resources 170 are used to store layout data files when not needed for geometric operations. As also explained additional detail below, Distributed File Manager module 160 functions to transfer data between main memory resources and storage (disk) memory resources, for example, in response to instructions received from the CBM 150. Additional features and aspects of CBM 150 and Distributed File Manager module 160 are provided below.

Figure 2:
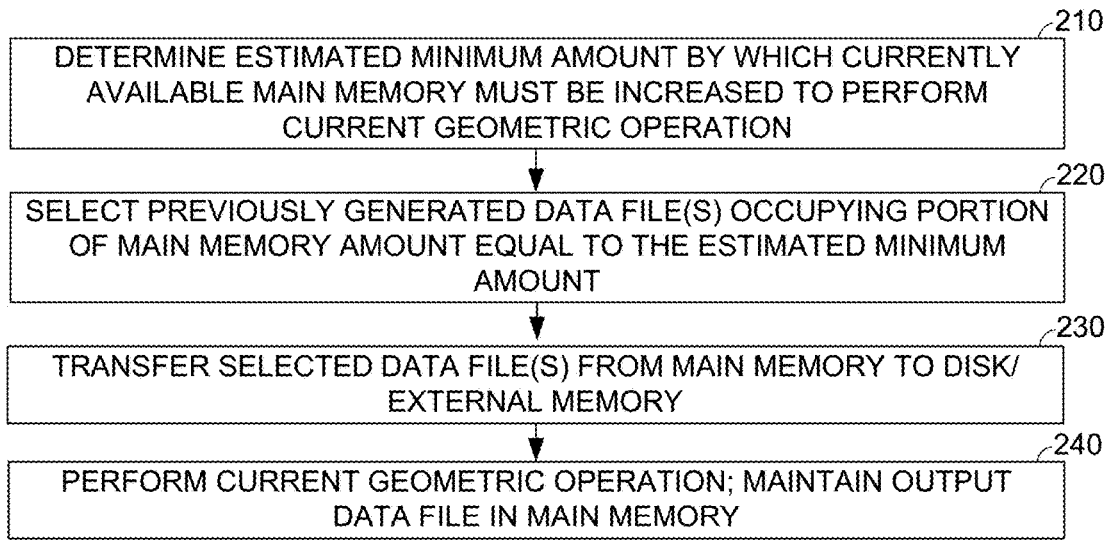
FIG. 2 is a flow diagram depicting a simplified dynamic memory management methodology according to a generalized embodiment of the present invention.
Figure 3:
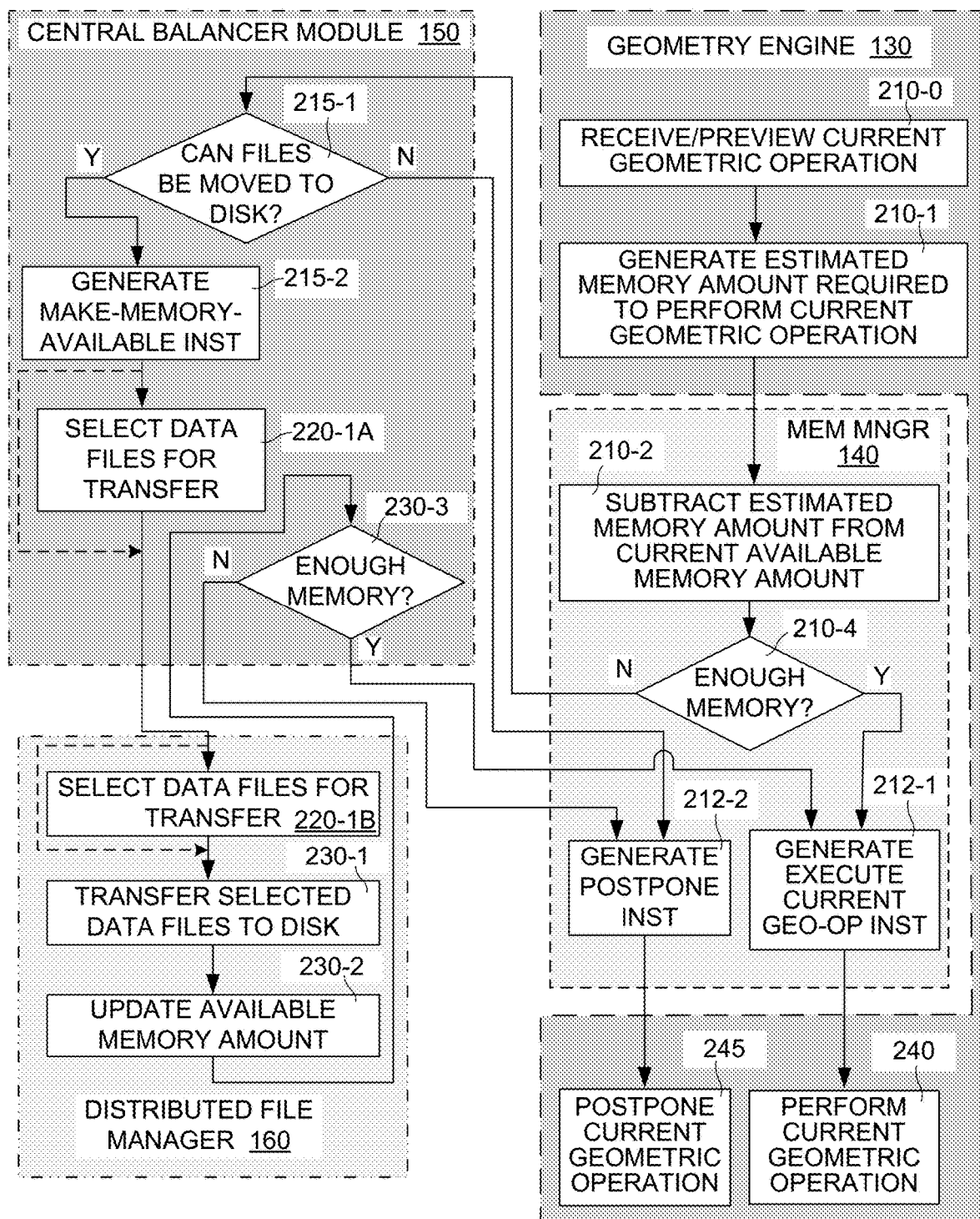
FIG. 3 is a block/flow diagram depicting a dynamic memory management methodology implemented by the improved layout verification tool of FIG. 1 according to an exemplary specific embodiment of the present invention.

FIG. 2 is a flow diagram depicting a dynamic memory management methodology implemented by layout verification tool 120 (FIG. 1) according to a generalized exemplary embodiment, and FIG. 3 is a block diagram showing a more detailed dynamic memory management methodology as implemented by layout verification tool 120 (FIG. 1) according to an exemplary specific embodiment. The examples depicted in these figures assume an intermediate stage of a layout verification process (i.e., after several geometric operations have been previously performed and associated layer data files have been generated) and just before a current (next-sequential) geometric operation is to be performed. For descriptive purposes, layout (output) data file 175-0 represents data generated during the current geometric operation, although it is understood that this file is empty and may not exist at the beginning of the example. Also for descriptive purposes, layer (output) data generated during the previously performed geometric operations is stored in corresponding previous Geometric Operation (Geo-Op) data files 175-1 and 175-2, where data files stored in main/internal memory resources 170 are identified as previous Geo-OP data files 175-1, and data files stored in disk/external memory resources 180 are identified as previous Geo-OP data files 175-2. Note that, when computing system 100 is a multi-core or other parallel computing system, one or more of data files 175-1 may include "current" geometric operation data that is concurrently being generated by another CPU of the system.

Referring to block 210 at the top of FIG. 2, before performing the "current" geometric operation, geometry engine 130 determines an estimated minimum amount by which an available portion of main memory resources 170 must be increased in order to perform the current geometric operation at peak processing speed. Referring to upper right portion of FIG. 3, in one embodiment this determining process is performed by geometry engine 130 and memory manager module (MEM MNGR) 140. First, geometry engine 130 receives and previews relevant details associated with the current geometric operation (block 210-0) and generates an estimated memory amount that would be required to perform the current geometric operation (block 210-1), and then geometry engine 130 sends the estimated minimum amount to memory manager 140. Note that this review process may occur at any time during execution of a geometric operation (e.g., if a first estimated minimum amount proves to be insufficient to complete a given geometric operation, then control is returned to block 210-0, and the remainder of the geometric operation is treated as a new "current" geometric operation). Upon receiving the estimated minimum amount, memory manager 140 calculates a difference between the current amount of available main memory and the estimated memory amount (e.g., by subtracting the estimated memory amount from the current available memory amount). In one embodiment, memory manager 140 utilizes the difference to determine if there is sufficient available memory to perform the current geometric operation (decision block 210-4). When the estimated memory amount is less than the current available memory amount, control passes (i.e., along the Yes branch from decision block 210-4) to block 212, where memory manager 140 generates and transmits an instruction for geometry engine 130 to perform the current geometric operation (block 240). Conversely, when the estimated memory amount is greater than the current available memory amount, control passes (i.e., along the No branch from decision block 210-4) to CBM 150. Note that the transfer of control to CMB 150 at this point represents a significant departure from conventional approaches. That is, as indicated by the No branch from decision block 73 in FIG. 7, according to the conventional approach the current geometric operation would be postponed. In contrast, referring again to FIG. 3, the No branch from decision block 201-4 passes control to CBM 150, and as described below, the decision to execute or postpone the current geometric operation is generated by CMB 150.

Referring to the upper left portion of FIG. 3, upon receiving control from memory manager 140 (i.e., by way of the No branch from decision block 201-4), CBM 150 determines whether an unavailable portion of main memory resources is occupied by previously generated geometric operation data files that may be moved to disk. For example, referring to FIG. 1, previously generated geometric operation output data files 175-1 that are currently stored in corresponding portions of main memory resources 170 and are not associated with concurrent geometric operations qualify for transfer to storage memory resources 180. If no such previously generated geometric operation output data files are present in the unavailable portion of main memory resources, then control passes back to memory manager 140 along the No branch from decision block 215-1, whereby the current geometric operation is postponed in the manner described above with reference to FIG. 7. Conversely, when one or more previously generated geometric operation output data files currently occupy the unavailable portion of main memory resources (Yes branch from decision block 215-1) an optional make-memory-available instruction is generated (block 215-2), and then control is effectively passed to block 220 (shown in FIG. 2).

Referring to block 220 of FIG. 2, when additional main memory is needed and it has been determined that one or more data files may be moved from main memory to disk/storage memory, one or more data files 175-1 are then selected based on the total (sum) of their file sizes such that the sum-total matches (or is as close as possible to matching) the estimated minimum amount as possible. By way of example, referring to FIG. 1, assume three previously generated layout data files 175-1 currently stored in main memory 170 respectively occupy 1 GB, 2 GB and 3 GB portions of main memory 170, and assume that an estimated minimum amount of 2 GB is generated for the current geometric operation. In this case, the data file 175-1 having the file size of 2 GB would only be selected for transfer to disk storage 180 because this data file's size occupies the exact amount of main memory space that is required to perform the current geometric operation. As a second example, assume three previously generated layout data files 175-1 currently stored in main memory 170 respectively occupy 1.1 GB, 1.5 GB, 2 GB and 2.5 GB memory portions, and assume that an estimated minimum amount of 3 GB is generated for the current geometric operation. In this case, the data files having the file sizes of 1.1 GB and 2 GB would only be selected for transfer because the sum-total of these data files provides the estimated memory amount (i.e., 3 GB) while minimizing the amount of unoccupied main memory that exceeds the estimated memory amount (i.e., the sum-total of 3.1 GB provides the estimated memory amount of 3 GB and produces an overage/excess of 0.1 GB, whereas no other single data file or combination of data files would provide at least 3 GB and have a smaller overage).

In alternative embodiments the selection of data files for transfer (block 220 of FIG. 2) is performed either by central balancer module 150 or by distributed file manager module 160. Referring to the upper left portion of FIG. 3, in one embodiment CBM 150 performs the selection process (block 220-1A) and transmits a list of data files to be transferred to distributed file manager module 160. In another embodiment, CBM 150 generates and transmits an optional make-memory-available instruction or command (block 215-2), and distributed file manager module 160 then performs the selection process (block 220-1B) in response to the make-memory-available instruction/command.

Referring to block 230 of FIG. 2, after selecting one or more data files, the selected data file(s) is/are transferred from main memory to disk memory. Referring to FIG. 1, the transfer process essentially involves moving one or more previously generated geometric operation data files 175-1 from main memory 170 such that, after the transfer process, a previous geometric operation data file 175-2 is stored in disk memory 180 for each corresponding transferred file 175-1 and includes the same data of the corresponding transferred file 175-1, and the corresponding transferred file 175-1 is erased or otherwise discontinued in main memory 170 (i.e. the memory space occupied by each corresponding transferred file 175-1 is re-designated as available memory space). Referring again to FIG. 3, in a presently preferred embodiment, the transfer is performed by distributed file manager module 160, which in a practical embodiment is utilized in conjunction with a Modern Linux Operating System to store layout data files either in a Tmpfs-based main memory resources or disk (storage) memory resources. This arrangement facilitates to transfer of selected data files can be moved from Tmpfs (main memory) to disk (secondary memory) when required. When the data-file-for-transfer selection process is performed by CBM 150, the list of selected data files to distributed file manager 160, which then transfers the listed files from Tmpfs (main memory) resources to disk (secondary memory) resources. Alternatively, when the data-file-for-transfer selection process is performed by distributed file manager module 160. Whether the data-files-for-transfer selection is performed by CBM 150 or distributed file manager module 160, this approach increases the amount of available Tmpfs (main) memory to facilitate the execution for geometric operations at peak processing speeds. In one embodiment, when the amount of available main memory changes in accordance with the file transfer process, distributed file manager module 160 updates the available main memory amount (block 230-2) and reports the updated available memory amount to CBM 150.

Referring to CBM 150 in FIG. 3, after the selection process is completed CBM 150 determines if the transfer has provided sufficient main memory space to perform the current geometric operation (decision block 230-3). If for some reason the transfer did not provide sufficient space (No branch from decision block 230-3), control is passed to memory manager module 140, which generates a postpone instruction (block 212-2) that causes geometry engine 130 to postpone the current geometric operation (block 245) in a manner similar to that used in conventional approaches. Conversely, if the transfer provides sufficient main memory to proceed (Yes branch from decision block 230-3), memory manager module 140 generates an execute instruction (block 212-1) that causes geometry engine 130 to perform the current geometric operation (block 240).

Figure 4:
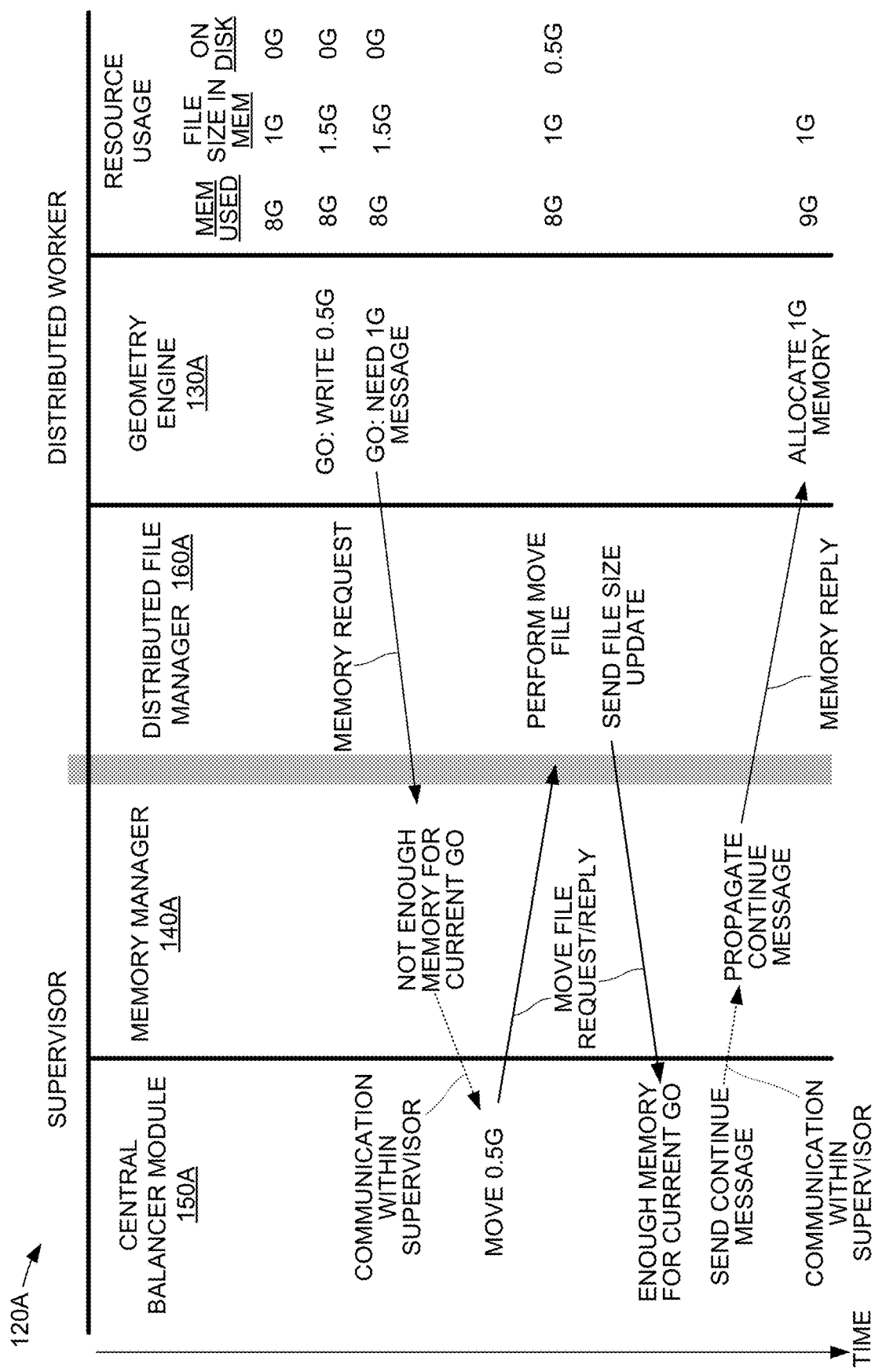
FIG. 4 is flow diagram depicting exemplary communications between various modules during operation of the improved layout verification tool of FIG. 1 according to another exemplary specific embodiment of the present invention.

FIG. 4 is flow diagram depicting communications that are generated/transmitted and associated operations performed during an exemplary operation of an improved layout verification tool 120A according to another exemplary embodiment. Improved layout verification tool 120A includes a geometry engine 130A, a memory manager module 140A, a central balancer module (CMB) 150A and a distributed file manager module 160A that are configured in a manner similar to that described above. In this case memory manager 140A and CBM 150A are collectively referred to as a supervisor, and geometry engine 130A and distributed file manager module 160A are collectively referred to as distributed workers. In this embodiment CBM 150A and memory manager 140A handle two types of messages: (first) messages that are related to memory requests (e.g., memory usage increases/decreases); and (second) messages related to moving data files from main memory to storage (e.g., disk) memory. Referring to the upper right portion of FIG.

4, when the change of memory usage is greater than a certain amount, geometry engine 130A sends a "need memory" (memory request) message to memory manager 140A. Memory request messages similar to those used by tool 120A were utilized in conventional tools, but the memory request messages used by tool 120A differ in that they contain in-memory file size information. In addition, with conventional tools the memory manager immediately instructs the geometry engine 130A to suspend a current geometric operation when insufficient free memory is available. In tool 120A, memory manager 140A consults with CBM 150A when insufficient memory is available by way an inter-supervisor communication. If CBM 150A decides to move selected data files from main memory to disk memory, a move file message is sent to distributed file manager module 160A, which performs the file transfer as described above. When distributed file manager module 160A finished moving the selected data files, it sends a move file reply message that includes the current memory usage status and whether it had succeeded in its task. Based on this new information, CBM 150A decides whether the current geometric operation should continue, and this decision is passed to memory manager module 140A, which in turn propagates the decision to geometric engine 130A.

Technology Specific EDA System/Workflow Explanation

Figure 5:
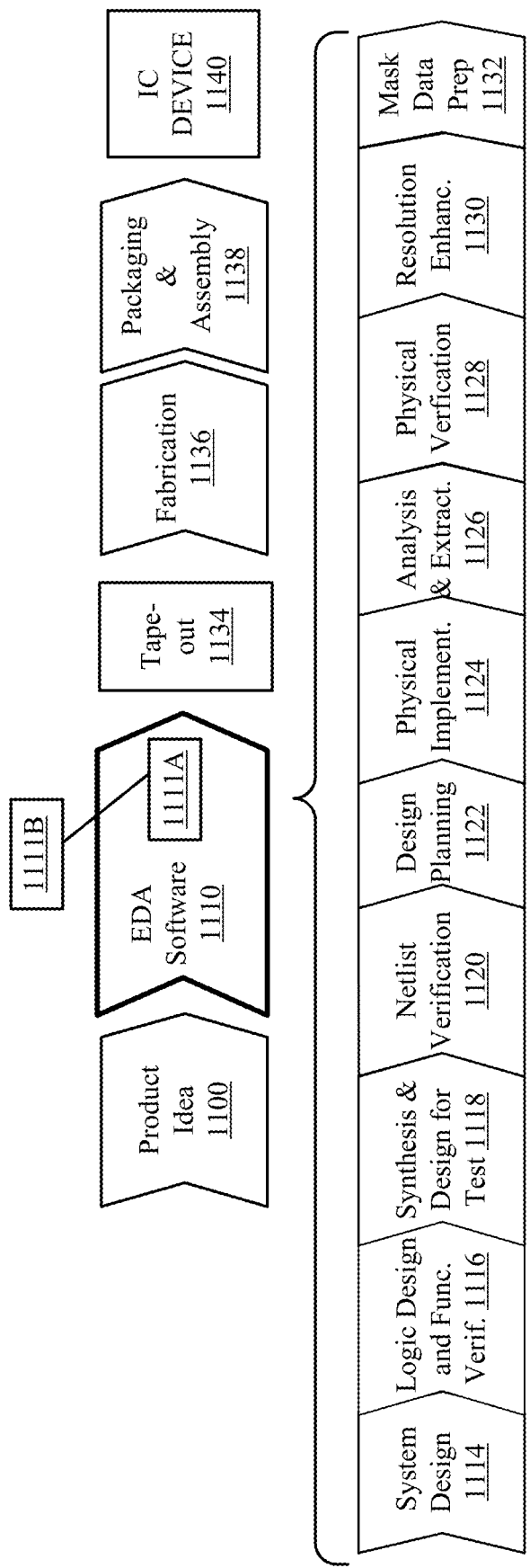
FIG. 5 is a flowchart illustrating various operations in the design and fabrication of an integrated circuit in accordance with an embodiment of the present disclosure.

FIG. 5 illustrates various processes performed in the design and fabrication of IC devices using EDA software tools with a computer to transform data and instructions that represent the associated IC devices. These processes start with the generation of a product idea (1100) with information supplied by one or more circuit designers. The product idea is realized as the evolving circuit design during the circuit design process performed by the circuit designer(s) using EDA software tools (1110). One or more steps of the EDA software design process performed by EDA software tools (1110) is implemented using a computer-readable medium 1111A that is read by a computer 1111B. EDA software tools may also be signified herein using the singular "EDA software tool/toolset" or "EDA tool/toolset", as EDA software, or as a design tool. When a circuit design is finalized, it is typically taped-out (1134), and then multiple ICs, each being a physical implementation of the final circuit design, are fabricated on a semiconductor wafer (1136) using a selected technology node. The semiconductor wafer is then diced into individual chips, with each chip including one of the ICs, and then the chips are packaged and assembled using corresponding processes (1138), resulting in finished IC device 1140.

Note that the design process that uses EDA software tools (1110) includes operations 1114-1132, which are described below. This design flow description is for illustration purposes only (i.e., to establish the context in which the present invention is typically implemented) and is not meant to limit the present disclosure. For example, an actual circuit design may require a circuit designer to perform the design operations in a different sequence than the sequence described herein.

During system design (1114), a circuit designer describes the functionality to be performed by the manufactured IC device. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products. Cells or other descriptions including all relevant information pertaining to specific circuit types are typically copied from a library accessible by way of the EDA software tool, and inserted into a circuit design during the system design process.

Then, during logic design and functional verification (1116), VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test (1118), VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification (1120), the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning (1122), an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During physical implementation (1124), the placement (positioning of circuit elements such as transistors or capacitors) and routing (connection of the same by a plurality of conductors) occurs. Exemplary EDA software products from Synopsys, Inc. of Mountain View, Calif. that can be used at this stage include: the Astro and IC Compiler products.

Then, during analysis and extraction (1126), the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification (1128), the design is checked to ensure correctness for manufacturing issues, electrical issues, lithographic issues, and circuitry. Exemplary EDA software products from Synopsys, Inc. of Mountain View, Calif. that can be used at this stage include the Hercules and IC Validator products. In one embodiment, the present invention is implemented in a physical (layout) verification tool utilized during physical verification.

Moreover, during resolution enhancement (1130), geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation (1132), the 'tape-out' data for production of masks to produce finished integrated circuits is provided. Exemplary EDA software products from Synopsys, Inc. of Mountain View, Calif. that can be used at this stage include the Cats. family of products.

For all of the above-mentioned integrated circuit design tools, similar tools from other EDA vendors, such as Cadence and Mentor Graphics can be used as an alternative. Additionally, similarly non-commercial tools available from universities can be used.

Embodiments of the present disclosure can be used during one or more of the above-described stages. Specifically, some embodiments of the present disclosure can be used in EDA software 1110.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Technology Specific General Computer Explanation

Figure 6:
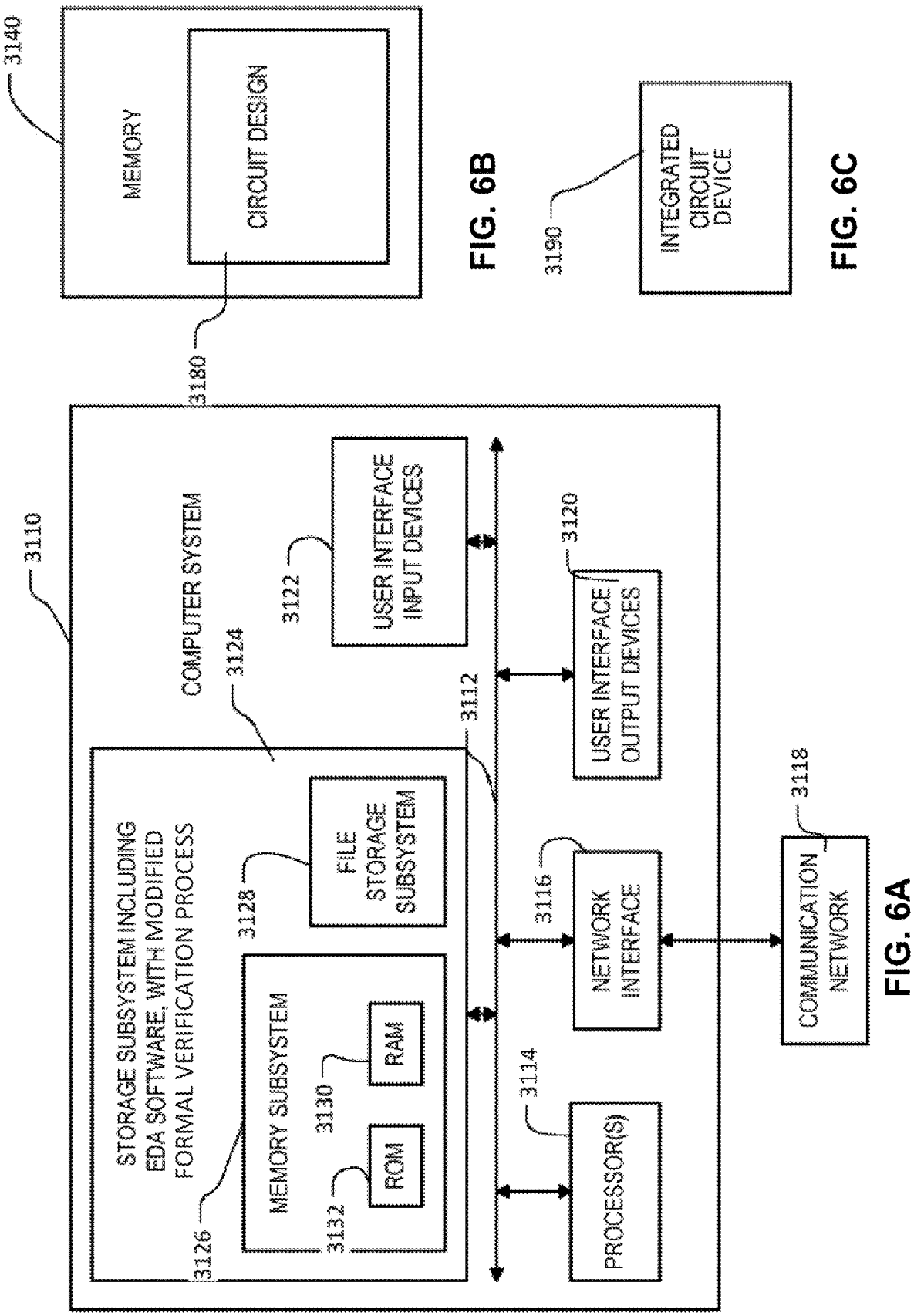
FIGS. 6A, 6B and 6C are simplified block diagrams of a computer system suitable for use with embodiments of the technology, as well as circuit design and circuit embodiments of the technology.

FIGS. 6A, 6B and 6C are simplified block diagrams of a computer system suitable for implementing an EDA tool that implements the methodology of the present invention described above. Computer system 3110 typically includes at least one computer or processor 3114 which communicates with a number of peripheral devices via bus subsystem 3112. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a television, a network router, switch or bridge, or any data processing machine capable of executing instructions 124 (sequential or otherwise) that specify actions to be taken by that machine. Innovations, embodiments and/or examples of the claimed inventions are neither limited to conventional computer applications nor the programmable apparatus that run them. To illustrate, the innovations, embodiments and/or examples of the claimed inventions can include an optical computer, quantum computer, analog computer, or the like. Aspects of the present invention are well suited to multi-processor or multi-core systems and may use or be implemented in distributed or remote systems. Processor here is used in the broadest sense to include singular processors and multi-core or multi-processor arrays, including graphic processing units, digital signal processors, digital processors and combinations of these elements. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 3110 depicted in FIG. 6A is intended only as a specific example for purposes of illustrating the preferred embodiments. Many other configurations of computer system 3110 are possible having more or less components than the computer system depicted in FIG. 6A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example the Internet.

User interface input devices 3122 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3110 or onto communication network 3118. User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide nonvisual display such as via audio output devices. In general, use of the term "output device" is intended to include all possible types of devices and ways to output information from computer system 3110 to the user or to another machine or computer system.

Memory subsystem 3126 typically includes a number of memories including a main random-access memory (RAM) 3130 for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 3128. Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses.

When configured to execute an EDA software tool including a TCAD tool of the type described above, computer system 3110 depicted in FIG. 6A represents an electronic structure suitable for executing at least a portion of the layout verification process as described above. In addition, the EDA tool includes software tools suitable for modifying the targeted circuit design to replace one or more non-compliant layout features with corrected/compliant features when a given geometric operation indicates that a given selected layout feature fails to satisfy an applied rule check. A final circuit design is then transmitted to a fabrication facility for production of a physical ASIC or SoC IC device (chip).

FIG. 6B shows a memory 3140 such as a non-transitory, computer readable data storage medium associated with file storage subsystem 3128, and/or with network interface subsystem 3116, and includes a data structure 3180 specifying a circuit design describing an integrated circuit (e.g., a SoC device or an ASIC). The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 6C is a block representing an integrated circuit 3190 (e.g., an SoC device or an ASIC) designed and fabricated in accordance with the processes described above, where circuit 3190 is fabricated in accordance with the circuit design of data structure 3180 (see FIG. 6B).

The foregoing Detailed Description signifies in isolation individual features, structures or characteristics described herein and any combination of two or more such features, structures or characteristics, to the extent that such features, structures or characteristics or combinations thereof are based on the present specification as a whole in light of the knowledge of a person skilled in the art, irrespective of whether such features, structures or characteristics, or combinations thereof, solve any problems disclosed herein, and without limitation to the scope of the claims. When an embodiment of a claimed invention comprises a particular feature, structure, or characteristic, it is within the knowledge of a person skilled in the art to use such feature, structure, or characteristic in connection with other embodiments whether or not explicitly described.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified. For example, although the present invention is primarily described herein with reference to DRC, it is understood that the invention may also be applied to other layout verification processes as well, such as LVS, XOR check, antenna check and ERC.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

The invention claimed is:

1. A method for managing memory resources during a layout verification process implemented in a computing system, the computing system including a processor directly coupled to main memory resources and indirectly coupled to storage memory resources, said layout verification process being configured to verify a layout description by performing a plurality of geometric operations, where each said geometric operation includes processing one or more previously-generated geometric operation data files and generating a corresponding current geometric operation data file, said method comprising:

before performing a current geometric operation of said plurality of geometric operations, determining an estimated minimum amount by which currently available memory of said main memory resources must be increased to perform said current geometric operation, said current available memory capacity being defined by a difference between a total capacity amount of said main memory resources and an unavailable portion of said total capacity amount occupied by one or more previously generated geometric operation data files;

selecting at least one data file from said one or more previously generated geometric operation data files, said at least one data file being selected such that a difference between an amount of said unavailable portion occupied by said at least one data file and said estimated minimum amount is minimized;

transferring said at least one selected data file from said main memory resources to said storage memory resources, whereby said current available memory amount of said main memory resources is increased by said amount of said unavailable portion occupied by said at least one data file; and performing said current geometric operation.

2. The method of claim 1, wherein said (determining said estimated minimum amount comprises:

generating an estimated memory amount required to perform said current geometric operation, and calculating a difference between said current available memory amount and said estimated memory amount.

3. The method of claim 2, further comprising, after determining said estimated minimum amount, determining whether said unavailable portion of said main memory resources includes one or more previously generated geometric operation data files.

4. The method of claim 1, further comprising, wherein said selecting said at least one data file is performed by a central balancer module.

5. The method of claim 1, further comprising, wherein said selecting said at least one data file is performed by a distributed file manager module.

6. The method of claim 1, wherein said transferring said at least one selected data file from said main memory resources to said storage memory resources is performed by a distributed file manager module that is operably coupled between said main memory resources and said storage memory resources.

7. The method of claim 1, further comprising, upon completing performance of said current geometric operation, maintaining layer data generated during said current geometric operation in a current geometric operation data file stored on said main memory resources when beginning performance of a next-sequential geometric operation.

8. In an electronic design automation (EDA) toolset implemented by a processor of a computing system, a layout verification tool configured to verify a layout description of a circuit design using a geometry engine configured to perform a plurality of geometric operations, the computing system including main memory resources that are directly coupled to the processor and storage memory resources that are indirectly coupled to the processor, wherein the geometry engine is configured such that each said geometric operation includes processing one or more previously-generated geometric operation data files and generating a corresponding current geometric operation data file, said layout verification tool including instructions that, when executed by said processor, cause the processor to perform a method comprising:

before performing a current geometric operation of said plurality of geometric operations, determining an estimated minimum amount by which currently available memory of said main memory resources must be increased to perform said current geometric operation, said current available memory capacity being defined by a difference between a total capacity amount of said main memory resources and an unavailable portion of said total capacity amount occupied by one or more previously generated geometric operation data files;

selecting at least one data file from said one or more previously generated geometric operation data files, said at least one data file being selected such that a difference between an amount of said unavailable portion occupied by said at least one data file and said estimated minimum amount is minimized;

transferring said at least one selected data file from said main memory resources to said storage memory resources, whereby said current available memory amount of said main memory resources is increased by said amount of said unavailable portion occupied by said at least one data file; and performing said current geometric operation.

9. The layout verification tool of claim 8,
wherein the layout verification tool includes a memory manager module, and
wherein said (determining said estimated minimum amount are performed by at least one of said geometry engine and said memory manager module and comprises:
generating an estimated memory amount required to perform said current geometric operation, and
calculating a difference between said current available memory amount and said estimated memory amount.

10. The layout verification tool of claim 9, wherein the layout verification tool further includes a central balancing module configured to determine whether said unavailable portion of said main memory resources includes one or more previously generated geometric operation data files.

11. The layout verification tool of claim 10, wherein the central balancing module is further configured to perform said selecting said at least one data file.

12. The layout verification tool of claim 10,
wherein the central balancing module is further configured to generate a make-memory-available instruction, and
wherein the layout verification tool further includes a distributed file manager module configured to perform said selecting said at least one data file in response to said make-memory-available instruction.

13. The layout verification tool of claim 12, wherein said distributed file manager module is further configured to perform said transferring said at least one selected data file from said main memory resources to said storage memory resources.

14. The layout verification tool of claim 13, wherein said distributed file manager module is further configured to maintain layer data generated during performance of said current geometric operation in a current geometric operation data file stored on said main memory resources when beginning performance of a next-sequential geometric operation.

15. An apparatus, comprising: a processor; and a non-transitory computer-readable storage medium storing instructions that, when executed by the processor, cause the processor to perform a method for managing memory resources during a layout verification process, the processor being directly coupled to main memory resources and indirectly coupled to storage memory resources, said layout verification process being configured to verify a layout description by performing a plurality of geometric operations, where each said geometric operation includes processing one or more previously-generated geometric operation data files and generating a corresponding current geometric operation data file, said method comprising:

before performing a current geometric operation of said plurality of geometric operations, determining an estimated minimum amount by which currently available memory of said main memory resources must be increased to perform said current geometric operation, said current available memory capacity being defined by a difference between a total capacity amount of said main memory resources and an unavailable portion of said total capacity amount occupied by one or more previously generated geometric operation data files;

selecting at least one data file from said one or more previously generated geometric operation data files, said at least one data file being selected such that a difference between an amount of said unavailable portion occupied by said at least one data file and said estimated minimum amount is minimized;

transferring said at least one selected data file from said main memory resources to said storage memory resources, whereby said current available memory amount of said main memory resources is increased by said amount of said unavailable portion occupied by said at least one data file; and performing said current geometric operation.

* * * * *

UNITED STATES PATENT AND TRADEMARK OFFICE
CERTIFICATE OF CORRECTION

Page 1 of 1

PATENT NO. : 10,706,208 B1
APPLICATION NO. : 16/542956
DATED : July 7, 2020
INVENTOR(S) : Hongchuan Li and Aydin Osman Balkan It is certified that error appears in the above-identified patent and that said Letters Patent is hereby corrected as shown below:

On the Title Page

Item (73) Assignee should read:
Synopsys, Inc., Mountain View, CA
(US)

Signed and Sealed this
Fifth Day of January, 2021

Andrei Iancu
*Director of the United States Patent and Trademark Office*